United States Patent [19]
Kawamoto

[11] Patent Number: 5,698,071
[45] Date of Patent: Dec. 16, 1997

[54] HIGH SPEED ASHING METHOD

[75] Inventor: Hideaki Kawamoto, Tokyo, Japan

[73] Assignee: NEC Corporation, Tokyo, Japan

[21] Appl. No.: 636,143

[22] Filed: Apr. 22, 1996

[30] Foreign Application Priority Data

Apr. 21, 1995 [JP] Japan ................... 7-096941

[51] Int. Cl.$^6$ ................................. H01L 21/00
[52] U.S. Cl. ................... 156/643.1; 134/1.2; 156/655.1; 156/656.1; 216/69; 216/77; 252/79.1
[58] Field of Search ................ 156/643.1, 646.1, 156/655.1, 656.1, 651.1, 345 MW; 216/67, 69, 77; 252/79.1; 134/1.2, 1.3

[56] References Cited

U.S. PATENT DOCUMENTS

| 5,200,031 | 4/1993 | Latchford et al. | 156/659.1 |
| 5,221,424 | 6/1993 | Rhoades | 216/77 X |
| 5,227,341 | 7/1993 | Kamide | 216/77 X |
| 5,380,397 | 1/1995 | Fukuyama et al. | 216/77 X |
| 5,545,289 | 8/1996 | Chen et al. | 216/77 X |

FOREIGN PATENT DOCUMENTS

| 0416774 | 3/1991 | European Pat. Off. |
| 0489179 | 6/1992 | European Pat. Off. |
| 4114741 | 1/1992 | Germany |
| 58-87276 | 5/1983 | Japan |
| 383337 | 4/1991 | Japan |
| WO9522171 | 8/1995 | WIPO |

Primary Examiner—William Powell
Attorney, Agent, or Firm—Sughrue, Mion, Zinn, Macpeak & Seas, PLLC

[57] ABSTRACT

A wafer (11) is conveyed in a vacuum from an Al etching chamber after the Al etching and is fed into an ashing chamber (15) without coming into contact with the atmosphere. After the wafer (11) was conveyed, CH$_3$OH gas of 200 sccm is first introduced by a valve (30$a$) and a pressure is adjusted to 1.2 Torr. Subsequently, a microwave current of 450 mA is supplied, thereby forming a plasma. The wafer (11) is processed by a down-flow system of a CH$_3$OH plasma. The supply of the CH$_3$OH gas is stopped by closing the valve (30$a$). Next, oxygen gas of 400 sccm is introduced by opening a valve (30$b$). A microwave current of 450 mA is supplied at a pressure of 1.2 Torr, thereby forming a plasma. A resist on the wafer 11 is ashed and eliminated by a down-flow process of an oxygen plasma. By those processes, the corrosion prevention and the resist ashing can be perfectly executed.

14 Claims, 5 Drawing Sheets

HIGH SPEED ASHING METHOD

BACKGROUND OF THE INVENTION

1. Field of the Invention

The invention relates to an ashing method in an ashing process after completion of an etching of aluminum or aluminum alloy (hereinafter, simply referred to as Al), whereby an Al corrosion is prevented and an ashing of a resist is performed at a high speed without causing a deterioration in reliability of an Al wiring.

2. Description of Related Art

As a conventional ashing method, as shown in Japanese Laid Open Patent Disclosure (JP-A-Show58-87276), a compound gas of fluorocarbon, for example, $CF_4$ and oxygen is used in a plasma process. Alternatively, as shown in JP-A-Hei3-83337, a post-processing method in which, for example, a plasma of methanol containing at least an H component is used has been proposed. By those methods, corrosion of an Al wiring is prevented and ashing of a resist is executed. As a processing procedure, a method in which a gas for prevention of the corrosion and an ashing gas are mixed and plasmanized and both of an anticorrosive process and ashing process are simultaneously executed. In another method, the anticorrosive process and ashing process may be separately executed.

As an above conventional ashing method, there have been proposed a method in which a corrosion preventing process of an Al wiring and a resist ashing process are simultaneously executed in a plasma process using a mixture oxygen gas and a gas for prevention of the corrosion, for example, $CF_4$ and methanol, a method in which a methanol gas and an oxygen gas are mixed and plasmanized and an anticorrosive process and ashing process are simultaneously executed, and a method of separately executing the steps by the respective gas plasmas.

Among those methods, according to the ashing method of simultaneously executing the corrosion preventing process and the resist ashing process, there are problems in that a corrosion preventing effect is insufficient, reliability of the wiring deteriorates, and an ashing eliminating ability of the resist also is reduced by adding the gas for prevention of the corrosion into the oxygen gas.

On the other hand, according to the method of executing the gas plasma processes separately for the corrosion preventing process and the resist ashing process, since those processes can be perfectly executed, they are advantageous as compared with the foregoing processing method of simultaneously executing. According to those methods, however, since they are based on the independent control, there are problems in that a processing time increases and a throughput is decreased. Nothing is pointed out with respect to a combination of functional groups and optimum conditions which are necessary to separately execute the corrosive process of the Al wiring and the ashing process.

SUMMARY OF THE INVENTION

It is an object to provide a method for performing an ashing process without decrease of a throughput and, also, without deterioration of reliability of a wiring.

In order to achieve an aspect of the present invention, in an ashing method after etching for forming wiring patterns of aluminum or aluminum alloy system on a wafer in a semiconductor device, a first plasma is generated in a chamber using a first single substance gas containing at least one of a H radical and an OH radical in a molecule to prevent corrosion of the wiring patterns. Subsequently, a second plasma is generated in the chamber using a second single substance gas consisting of an oxygen gas.

The first single substance gas is one of the group consisting of water ($H_2O$), hydrogen ($H_2$), methanol ($CH_3OH$), ethanol ($C_2H_5OH$), propanol ($C_3H_7OH$), and butanol ($C_4H_9OH$). The first single substance gas is supplied into the chamber at a flow rate of 140 sccm or more. At that time, a pressure of the first single substance gas is equal to 1 to 2 Torr. A pressure of the second single substance gas may be equal to 1 to 2 Torr. In the preferred embodiment, the wafer is heated within a temperature range of 180° to 240° C. before generation of a first plasma and holding the wafer at the temperature during the first plasma. The wafer may be heated before generation of the second plasma.

In order to achieve another aspect of the present invention, an ashing method after etching for forming wiring patterns of aluminum or aluminum alloy system on a wafer in a semiconductor device, includes the steps of:

executing a first processing for preventing the wiring pattern from corrosion using a first plasma of a first single substance gas containing at least one of a H radical and an OH radical in a molecule; and executing a second processing for ashing a resist used in the etching using a second plasma of a second single substance gas consisting of an oxygen gas.

DESCRIPTION OF THE PREFERRED EMBODIMENTS

The ashing apparatus of the present invention will be described below in detail with reference to the accompanying drawings.

First, the outline of the present invention will be described. In an ashing method of the present invention, after completion of etching of aluminum (Al) or aluminum alloy wiring pattern, a first plasma process is executed using a single substance gas containing an H radical or an OH radical. Subsequently, a second plasma process is executed using a single substance consisting of an oxygen gas. In the present invention, it is preferable that a gas flow rate of the first single substance gas is equal to or larger than 140 sccm and pressures in the first and second plasma processes are set to 1 to 2 Torr and temperatures of a wafer at the times of the first and second plasma processes are set to 180° to 240° C.

According to the present invention, the plasma process is first executed by using the first single substance gas containing the H radical or OH radical at a gas flow rate of 140 sccm or more and at a pressure of 1 to 2 Torr. Subsequently, another plasma process is executed using the second single substance gas consisting of the oxygen gas. Thus, a high preventing effect of the wiring corrosion can be obtained through the first plasma process. A high resist ashing effect can be obtained through the second plasma process using the oxygen gas. Therefore, the processes in which no Al corrosion occurs and the resist can be perfectly peeled off can be executed in a short processing time. It is desirable to keep the wafer temperature within a range from 180° to 240° C. This is because in order to effectively suppress the corrosion of the wiring, a processing temperature of 180° C. or higher is necessary and, in order to effectively suppress the occurrence of a hillock of Al that becomes a cause of deterioration of the reliability of the wiring, a temperature process of 240° C. or lower is needed. In case of using Si as a reflection preventing film on Al in a wiring structure, when a high temperature process is executed, Si is diffused into Al and causes the reliability of the wiring to be deteriorated. Therefore, a process in a range of 180° to 200° C. is proper.

Figure 1:
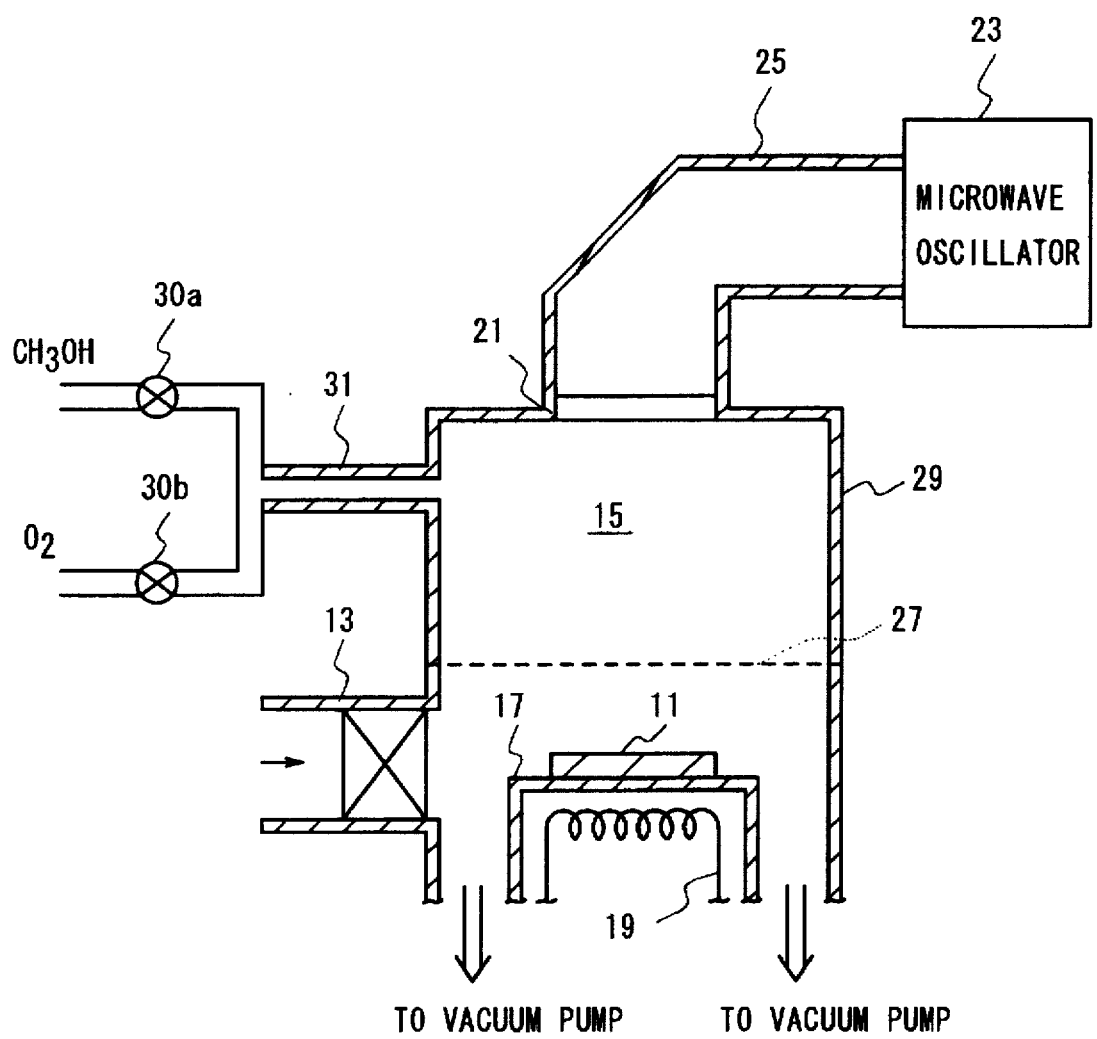
FIG. 1 is a block diagram showing an outline of an ashing apparatus in the first embodiment of the invention.
Figure 2:
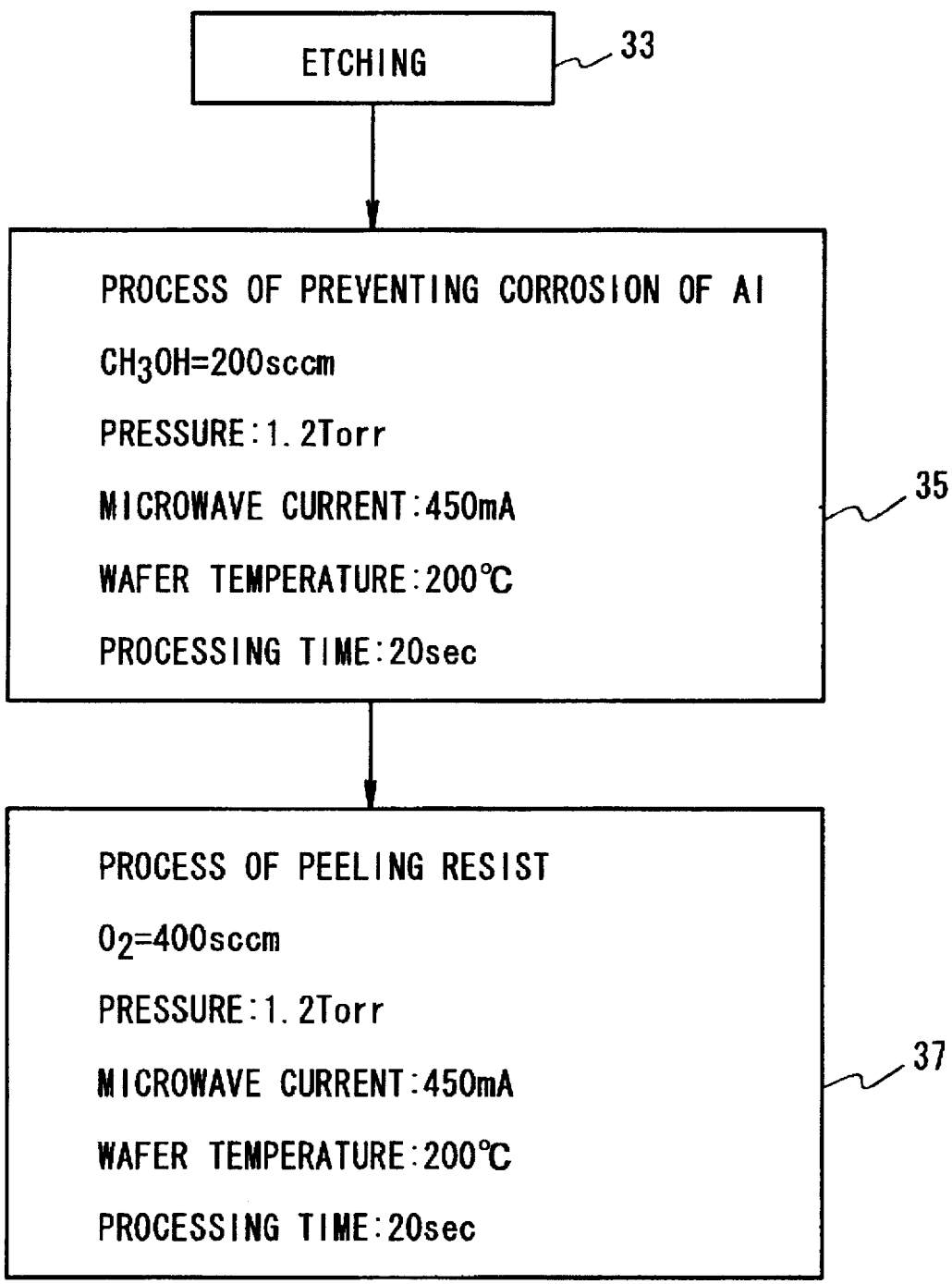
FIG. 2 is a flow chart for explaining an ashing method using the apparatus of FIG. 1.

Next, the ashing method according to the first embodiment of the present invention will be described below. FIG. 1 is a cross sectional view showing an outline of an ashing apparatus according to the first embodiment of the invention. FIG. 2 is a diagram showing an ashing method using the apparatus of FIG. 1. Referring to FIG. 1, after completion of etching of aluminum or aluminum alloy wiring patterns, a wafer 11 is conveyed in a vacuum from an Al etching chamber through an introducing passage 13 and is fed into an ashing chamber 15 without coming into contact with the air and is placed onto a wafer stage 17. The wafer stage 17 has a heater 19 and can heat the stage. The ashing chamber 15 is exhausted by a vacuum pump (not shown) and is in a pressure reducing state. A microwave of 2.45 GHz is introduced from a microwave oscillator 23 through a microwave waveguide 25 via a quartz plate 21. The ashing chamber 15 is partitioned by a punching plate 27 and a plasma is produced in a plasma generating chamber 29 by the introduction of the microwave. Active species formed in the plasma generating chamber 29 are conveyed onto the wafer 11 on the wafer stage 17 on the downstream side and the wafer 11 is processed. The ashing apparatus is an apparatus having a down-flow system as mentioned above.

Figure 3:
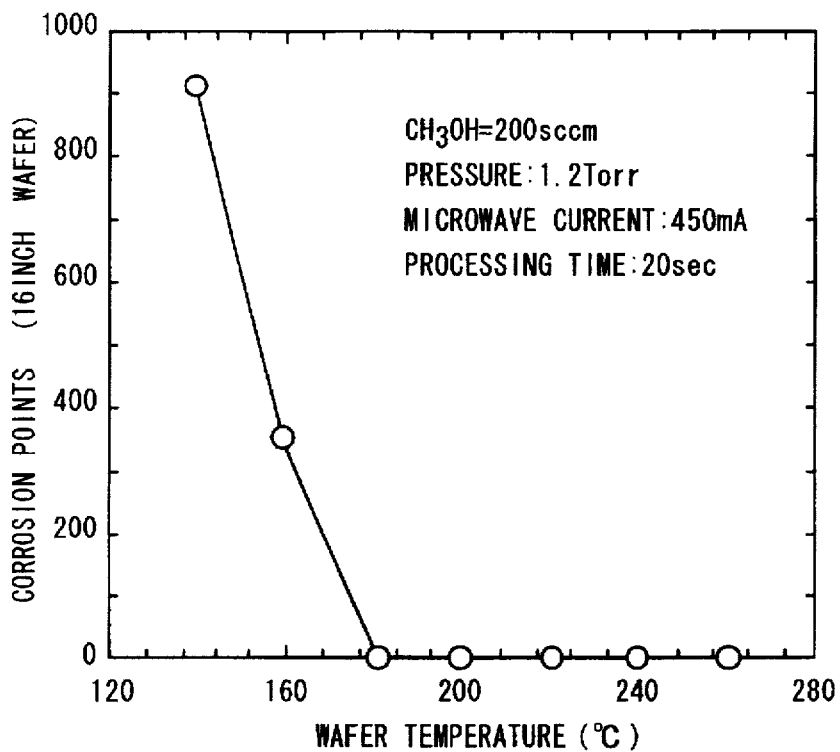
FIG. 3 is a graph showing an example of a dependency of occurrence points of Al corrosion on a temperature of a wafer stage.
Figure 4:
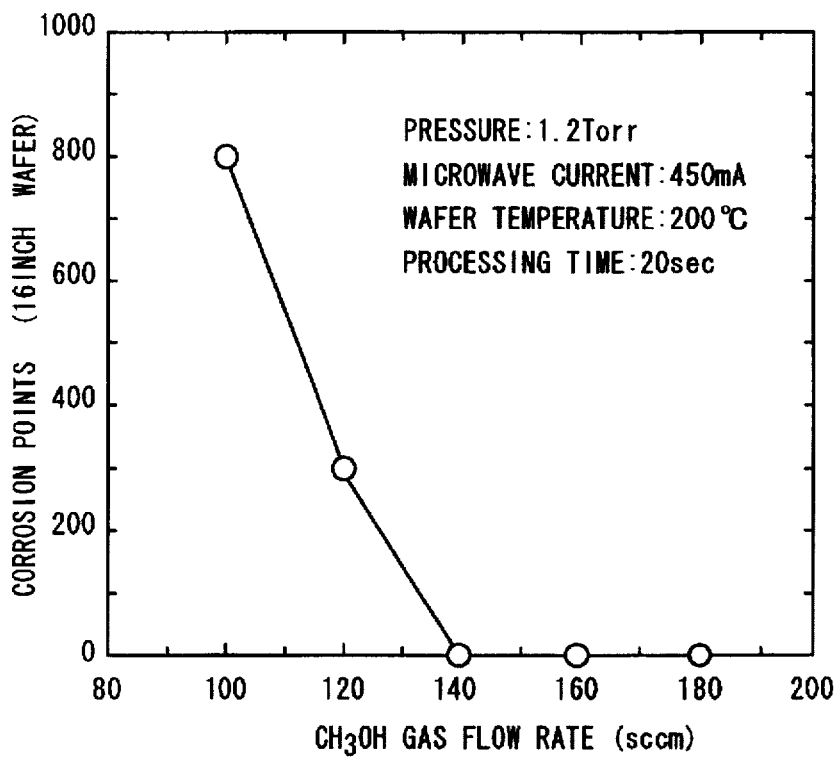
FIG. 4 is a graph showing a dependency of occurrence points of the Al corrosion on a flow rate of a methanol gas.

Also referring to FIG. 2, at a step 33, the wafer 11 is etched and the wafer 11 was first conveyed and placed onto the wafer stage 17 in an Al corrosion preventing process 35. FIG. 3 is a diagram showing the relation between the temperature of the wafer stage and corrosion points. As shown in FIG. 3, the Al corrosion preventing effect is larger as the temperature of the wafer stage is higher. On the other hand, however, according to the high temperature process, a hillock is likely to occur in Al and becomes a cause of deterioration in reliability of the wiring pattern. Therefore, the optimum plasma processing temperature is set to 180° to 240° C. Therefore, the temperature of the wafer stage 17 was set to 200° C. in this embodiment. Subsequently, a CH$_3$OH gas was introduced from a gas introducing port 31 via a valve 30a. FIG. 4 is a diagram showing the relation between the gas flow rate and the Al corrosion. In FIG. 4, it will be understood that the corrosion can be perfectly prevented from a point when a flow rate of a methanol gas is equal to or larger than 140 sccm. Therefore, the flow rate of CH$_3$OH was 200 sccm in the embodiment. The pressure of CH$_3$OH is preferably in a range 1 to 2 Torr. Therefore, the pressure of CH$_3$OH was adjusted to 1.2 Torr in the embodiment. A microwave current of 450 mA is supplied and a plasma is produced. The wafer 11 is processed in the down-flow system of a CH$_3$OH plasma. A processing time is set to 20 seconds. By the process, residual chlorine which was adsorbed on the surface of the Al wiring patterns at the time of the etching of the wiring patterns and becomes a cause of Al corrosion is eliminated and the corrosion can be perfectly prevented.

A resist ashing process 37 was subsequently continuously executed. The supply of the CH$_3$OH gas was stopped by closing the valve 30a. An oxygen gas of 400 sccm was introduced by opening a valve 30b. A microwave current of 450 mA was supplied at a pressure of 1.2 Torr, thereby forming a plasma. The resist on the wafer was ashed and eliminated by the down-flow process of an oxygen plasma. A time that was required to completely eliminate the resist was equal to 40 seconds. By the above processes, the corrosion prevention and the resist ashing could be perfectly executed in total 60 seconds.

Figure 5:
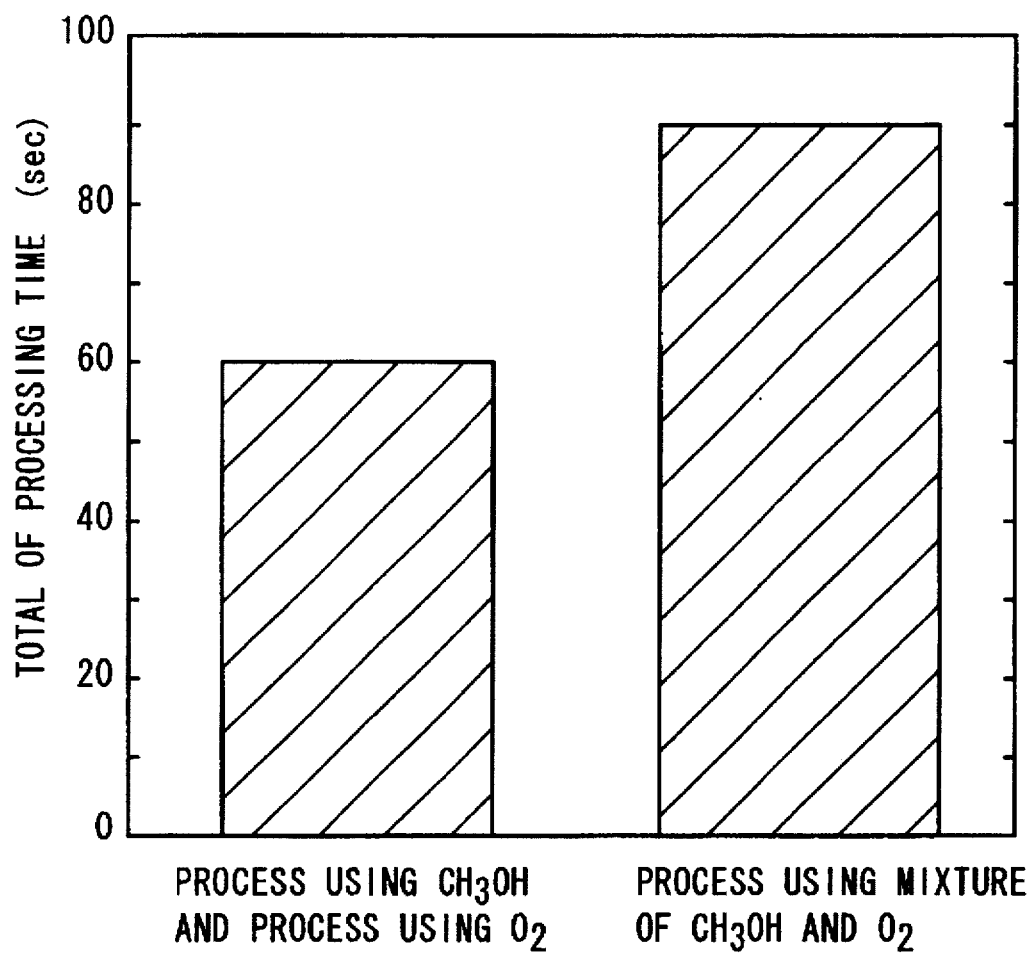
FIG. 5 is a diagram showing comparisons of a total processing time in the first embodiment of the invention and a total processing time in case of using a mixture gas of oxygen+methanol.

FIG. 5 is a diagram showing a comparison of the processing times. The left-side bar indicates the processing time required until the resist is perfectly ashed without causing an Al corrosion in the above embodiment and the right-hand bar indicates the processing time in the case where a mixture gas of oxygen (400 sccm) and methanol (200 sccm) is used in both the processes. Although the processing time is totally equal to 60 seconds in the present invention, 90 seconds were needed in case of using the mixture gas of oxygen+methanol. According to the invention, it will be understood that the processing time can be reduced and a processing ability of the apparatus can be improved.

Figure 6:
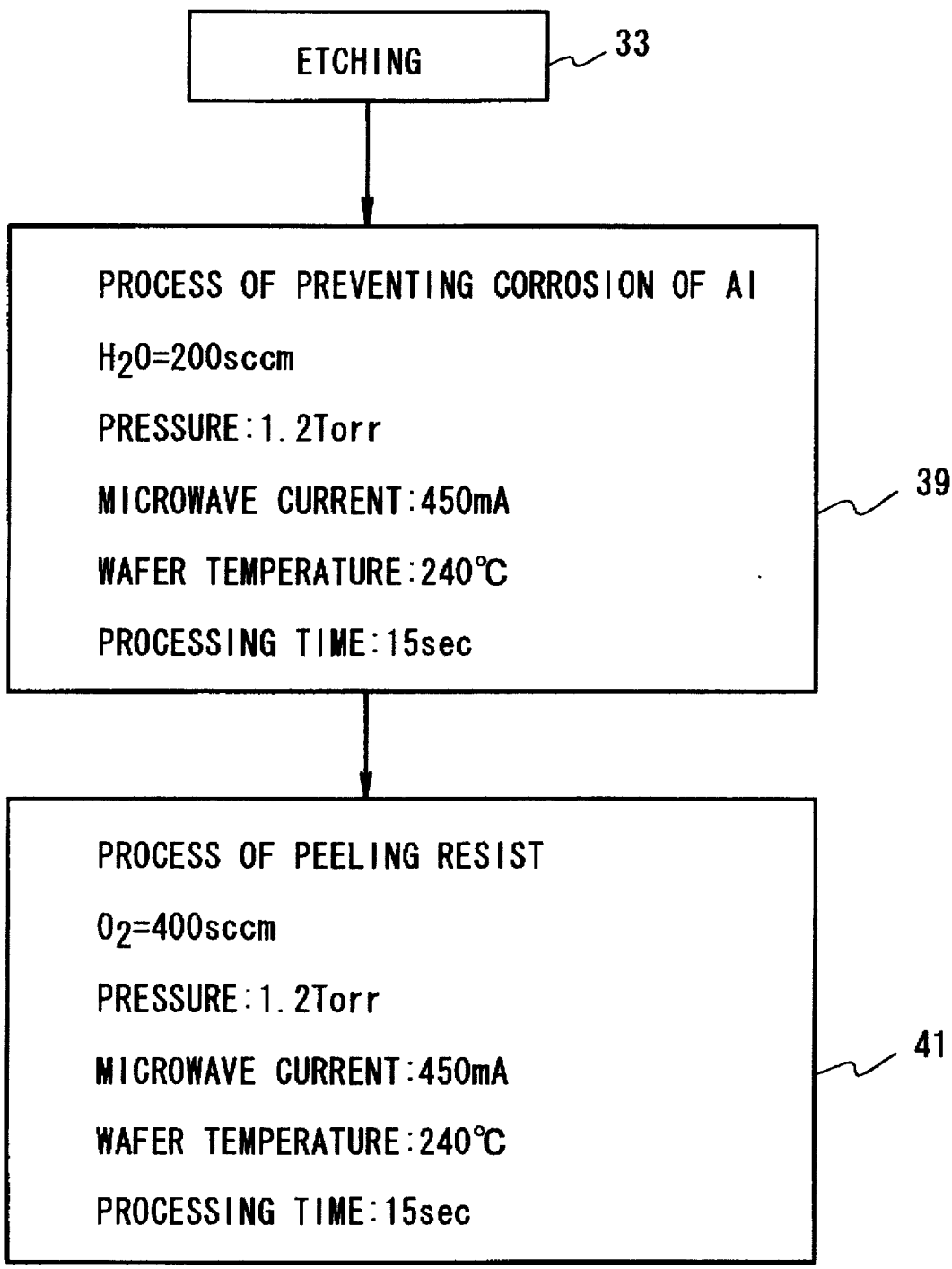
FIG. 6 is a flow chart of ashing steps in the second embodiment of the invention.

FIG. 6 is a diagram showing an ashing method according to the second embodiment of the invention. An apparatus similar to that shown in FIG. 1 is used. Referring to FIG. 6, the wafer after completion of the Al etching was conveyed in a vacuum to the ashing apparatus shown in FIG. 1. An Al corrosion preventing process 39 was executed. A temperature of the wafer stage was set to 240° C. Subsequently, an H$_2$O gas of 500 sccm was introduced via the valve 30a. A pressure was adjusted to 1.2 Torr. A microwave current of 450 mA is supplied, thereby forming a plasma. The wafer is processed by the down-flow system of an H$_2$O plasma. A processing time was equal to 15 seconds. By this process, the corrosion could be perfectly prevented in a manner similar to the first embodiment. After that, a resist ashing process 41 was executed. The supply of the H$_2$O gas was stopped by closing the valve 30a. An oxygen gas of 400 sccm was introduced by opening the valve 30b. A microwave current of 450 mA was supplied at a pressure of 1.2 Torr, thereby producing a plasma. A resist on the wafer was ashed and eliminated by the down-flow process of the oxygen plasma. A time that was required to completely eliminate the resist was equal to 35 seconds. The reason why the processing time was shorter than that in the first embodiment was because the down-flow process of the H$_2$O gas plasma also had a slight resist ashing effect. By the above process, the corrosion prevention and the resist ashing could be completely performed in total 50 seconds.

In the above embodiment, methanol (CH$_3$OH) and water (H$_2$O) have been used as a first single substance gas containing the H radical or OH radical, respectively. However, a similar effect was obtained even by using hydrogen (H$_2$), ethanol (C$_2$H$_5$OH), propanol (C$_3$H$_7$OH), and butanol (C$_4$H$_9$OH).

As described above, according to the invention, in the ashing process after completion of the Al system etching, the ashing method which can perfectly perform the prevention of the Al corrosion and the resist ashing in a short processing time without causing the deterioration of the reliability of the Al wiring can be provided.

What is claimed is:

1. An ashing method after etching for forming wiring patterns of aluminum or aluminum alloy system on a wafer in a semiconductor device, comprising the steps of:

generating in a chamber a first plasma using a first single substance gas containing at least one of a H radical and an OH radical in a molecule to prevent corrosion of the wiring patterns; and generating in the chamber a second plasma using a second single substance gas consisting of an oxygen gas.

2. An ashing method according to claim 1, wherein said first single substance gas is one selected from the group consisting of water ($H_2O$), hydrogen ($H_2$), methanol ($CH_3OH$), ethanol ($C_2H_5OH$), propanol ($C_3H_7OH$), and butanol ($C_4H_9OH$).

3. An ashing method according to claim 1, wherein said first single substance gas is supplied into the chamber at a flow rate of 140 sccm or more.

4. An ashing method according to claim 1, wherein a pressure of the first single substance gas is equal to 1 to 2 Torr.

5. An ashing method according to claim 1, wherein a pressure of the second single substance gas is equal to 1 to 2 Torr.

6. An ashing method according to claim 1, further including heating the wafer within a temperature range of 180° to 240° C. before said step of generating a first plasma and holding the wafer at the temperature during the first plasma.

7. An ashing method according to claim 1, further including heating the wafer within a temperature range of 180° to 240° C. before said step of generating a second plasma and holding the wafer at the temperature during the first plasma.

8. An ashing method after etching for forming wiring patterns of aluminum or aluminum alloy system on a wafer in a semiconductor device, comprising the steps of:

executing a first processing for preventing the wiring pattern from corrosion using a first plasma of a first single substance gas containing at least one of a H radical and an OH radical in a molecule; and executing a second processing for ashing a resist used in the etching using a second plasma of a second single substance gas consisting of an oxygen gas.

9. An ashing method according to claim 8, wherein said first single substance gas is one selected from the group consisting of water ($H_2O$), hydrogen ($H_2$), methanol ($CH_3OH$), ethanol ($C_2H_5OH$), propanol ($C_3H_7OH$), and butanol ($C_4H_9OH$).

10. An ashing method according to claim 8, wherein said first single substance gas is supplied into the chamber at a flow rate of 140 sccm or more.

11. An ashing method according to claim 8, wherein a pressure of the first single substance gas is equal to 1 to 2 Torr.

12. An ashing method according to claim 8, wherein a pressure of the second single substance gas is equal to 1 to 2 Torr.

13. An ashing method according to claim 8, further including heating the wafer within a temperature range of 180° to 240° C. before said step of generating a first plasma and holding the wafer at the temperature during the first plasma.

14. An ashing method according to claim 8, further including heating the wafer within a temperature range of 180° to 240° C. before said step of generating a second plasma and holding the wafer at the temperature during the first plasma.

* * * * *